United States Patent [19]

Copeland et al.

[11] Patent Number: 5,726,864
[45] Date of Patent: Mar. 10, 1998

[54] CAGE SYSTEM

[75] Inventors: Jeffrey P. Copeland, Jefferson; Dennis Robinson, Marlboro, both of Mass.

[73] Assignee: Digital Equipment Corporation, Maynard, Mass.

[21] Appl. No.: 518,936

[22] Filed: Aug. 24, 1995

[51] Int. Cl.⁶ ...................................................... H05K 7/14
[52] U.S. Cl. .................... 361/800; 361/799; 361/690; 361/685; 361/686; 361/725; 361/727; 361/818; 174/35 R
[58] Field of Search ................................ 361/799, 800, 361/687, 690, 683–686, 724–727, 814, 816, 818, 212, 220, 796, 810; 174/35 R, 35 GC, 35 MS, 35 TS; 364/708.1

[56] References Cited

U.S. PATENT DOCUMENTS

| | | | |
|---|---|---|---|
| 5,014,160 | 5/1991 | McCoy, Jr. | 361/818 |
| 5,165,055 | 11/1992 | Metsler | 333/12 |
| 5,233,594 | 8/1993 | Wilhelm | 369/75.1 |
| 5,323,299 | 6/1994 | Weber | 362/818 |
| 5,335,147 | 8/1994 | Weber | 361/818 |

*Primary Examiner*—Leo P. Picard
*Assistant Examiner*—Phuong T. Vu
*Attorney, Agent, or Firm*—Ronald C. Hudgens; Arthur W. Fisher; Krishnendu Gupta

[57] ABSTRACT

This invention packages option devices, such as floppy drives and hard disk drives, within an enclosure, thereby providing EMI/RFI shielding, promoting unimpeded option device electronic signaling, and reducing wasted space within an enclosure, such that small enclosures may encase the components. This invention includes a cage, for holding option devices, that is groundingly mounted in spaced relation to the major surface of a logic board, and an option device bracket that is slideably mounted within the cage. Each of the option device brackets contains one option device.

4 Claims, 5 Drawing Sheets

CAGE SYSTEM

FIELD OF THE INVENTION

This invention relates to electronics, and more particularly to the arrangement of electrical devices and logic boards, to reduce the size of computer enclosures while maintaining effective EMI (electromagnetic interference) and RFI (radio frequency interference) shielding.

BACKGROUND OF THE INVENTION

Electronic systems, such as computer and telecommunication systems, include logic boards and electrical devices positioned within an enclosure that require EMI/RFI shielding. Prior art reduces EMI/RFI emissions through an enclosure's external openings, such as the slots of option devices (i.e., floppy disk drives, hard disk drives and CD ROMs), by requiring the soldering of shielding materials directly to a logic board and the fastening of other shielding materials to soldered shielding material by use of screws or other fastening hardware. Moreover, prior art reduces option device exposure from high frequency EMI/RFI emissions of high clock speed logic board circuitry and components mounted thereon by sealing the logic board in a box made of EMI/RFI shielding material and mounting option deuces off to one side of the logic board, thereby reducing the option devices exposure from high frequency EMI/RFI emissions of high clock speed logic board circuitry and components mounted thereon and preventing EMI/RFI from affecting susceptible electronic circuits mounted within the computer enclosure.

The problem of EMI/RFI containment is made worse when option devices, such as floppy drives, hard drives and CD ROMs, are positioned close to a logic board incorporating high clock speed circuitry and components mounted thereon. For this reason prior art systems mount option devices a distance off to one side of the logic board, such that the distance between the option devices and logic board assist in reducing the effects of EMI/RFI between option devices and the high clock speed circuitry of the logic board and other components mounted thereon, but mounting option devices off to one side of the logic board require computer enclosures with dimensions greater than the length and/or width of the logic board.

Prior EMI/RFI shielding apparatus systems suffer from limitations in providing EMI/RFI shielding, and do not provide a means of mounting option devices to decrease wasted computer enclosure space, thereby reducing computer enclosure size. Prior systems prevent EMI/RFI emissions through a computer enclosure's option device openings by soldering multiple pieces of fastening hardware to a logic board in a labor intensive, costly manufacturing process making future logic board repairs both difficult and costly. Prior systems also use sealed boxes to shield EMI/RFI from sensitive electronic circuitry, a typically expensive and space inefficient method requiring large computer enclosures.

Although systems have tried many different EMI/RFI shielding methods, there continues to be a need to reduce the size of a computer enclosure while providing shielding to meet FCC's strict EMI/RFI emission requirements. As a consequence, there is a need for a system to arrange option devices and a logic board within an enclosure such that a small enclosure encases an option device and a logic board, while providing effective EMI/RFI shielding.

SUMMARY OF THE INVENTION

An object of this invention is an improved arrangement of electrical devices within an enclosure to reduce enclosure size and provide effective EMI/RFI shielding.

Another object of this invention is a system for holding electrical devices in closely spaced relation to the major surface of a logic board to reduce enclosure size and provide effective EMI/RFI shielding.

Still another object of this invention is to EMI/RFI shield and electrically ground a cage system while providing substantial etching areas for unimpeded signal routing through one or more layers of a logic board.

In a broad sense, these and other objects are attained by a system comprising an electrically grounded receptacle or cage for holding electrical devices mounted on a logic board to form an EMI/RFI shield.

In a narrower sense, these and other objects are attained by using a cage to hold an electrical device, such as a floppy disk drive, grounded to an electrical grounding source and mounted to grounding pads on the major surface of a logic board to form an EMI/RFI shield. The grounding source can be a grounding plane, whereby plated through holes, "blind vias" within the logic board electrically connect the option cage to the ground plane thereby grounding the option receptacle and forming an EMI/RFI shield.

The invention further embraces a means of mounting the option device within the option receptacle. The cage system further includes an option device bracket for holding an electronic device, such option device bracket being slideably mounted within the cage.

The instant invention provides a number of advantages. For example, it is generic in its approach by providing a system that reduces enclosure size and provides EMI/RFI shielding of an electrical device within a cage mounted on a logic board in spaced relation to a major surface thereon. Applicable uses in other embodiments of the invention include the mounting of electrical devices, such as option devices (i.e., floppy disk drives, hard disk drives, CD ROM drives, PCMCIA cards, fax modems, ect.) held within the option device bracket of the cage attached to a logic board. Further, because this invention is applicable for use with many types of electrical devices, this invention may be used with computers, telecommunication devices, stereo equipment, home entertainment electronic devices, electrical monitors, appliances, and many other devices where an electrical device is mounted within an enclosure, while shielding the communication of EMI/RFI emissions and reducing enclosure size. Another advantage is that due to the proximity of the option devices to the logic board, short cables may be used to connect the option devices to the option connectors mounted on the logic board, thereby providing for strong and unimpeded electrical signaling. Another advantage is that use of "signal and/or blind via's" electrically connect the grounding pads to the grounding plane while providing substantial etching areas with unimpeded signal routing through one or more layers of the logic board.

Other objects and advantages of the invention will become apparent as the invention is hereinafter described in more detail with reference made to the following drawings.

DETAILED DESCRIPTION OF THE PREFERRED EMBODIMENT

The invention is particularly applicable to compact mounting of electrical devices within a cage attached to a logic board within an enclosure, such as a computer enclosure. In the embodiment shown in the figures, the electrical devices are option devices such as floppy drives, hard disk drives, CD ROMs, etc. The invention provides EMI/RFI shielding between high and slow clock speed electronic circuitry and devices, shields high frequency EMI/RFI from leaving the computer enclosure through the slots of the option devices, and promotes efficient use of space within a computer enclosure, such that a small enclosure providing a small footprint on a surface area may be used to encase a computer. However, as will become apparent, the invention has greater utility and is applicable to numerous situations in which a small enclosure with a small footprint is used to encase high speed electrical devices generating high frequency EMI/RFI.

Figure 1:
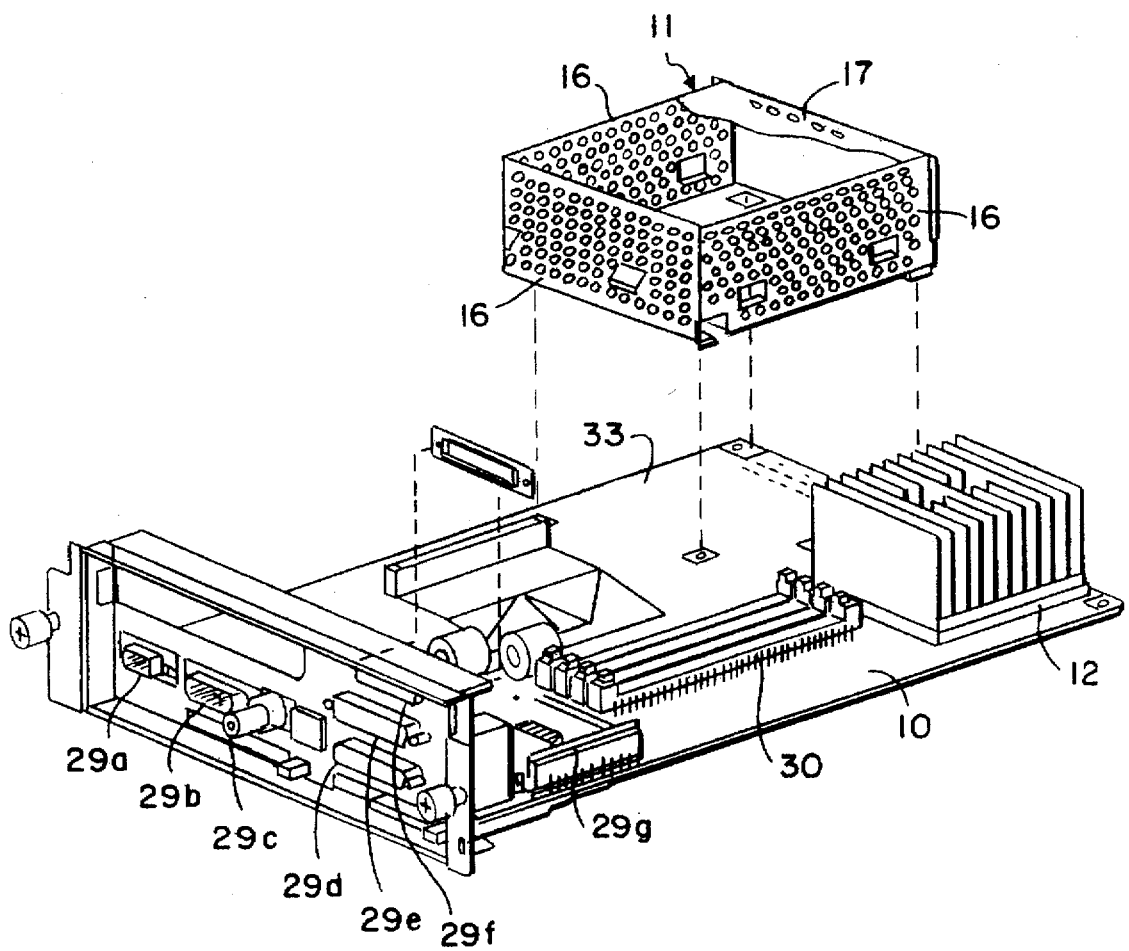
FIG. 1 is a rear perspective view of a partially exploded cage, electrical components, and a logic board according to the principles of this invention. A cage of rigid material for holding electrical devices therein is shown groundingly mounted on the logic board to form an EMI/RFI shield. The shielding of EMI/RFI impedes the transfer of EMI/RFI emissions between the electrical circuitry and computer option devices internal and external to the cage.

Referring now to the drawings, and particularly to FIG. 1, where is shown a logic board 10 of a computer system and a cage 11 of rigid material groundingly mounted on a major surface of the logic board 10. The logic board 10 generally includes various electronic components, such as I/O connectors 29 and memory connectors 30 mounted on its major surface area, and electronic circuitry and etching within multiple layers of the logic board 10. The cage 11 generally includes three walls 16 having apertures and a top 17 (shown with diagonal lines).

Some of the electronic components, as described herein, operate at high frequencies or high clock speeds that produce EMI/RFI which can interfere with the operation of other electronic components and may leave through option device openings mounted within a computer enclosure. Other electronic components having low clock speeds, produce low frequency EMI/RFI, which interfere with other electronic components operation to a lesser degree than high frequency EMI/RFI. The computer enclosure encasing the computer elements as shown in FIG. 1, contains some of the high frequency EMI/RFI emitting electrical components, such as the CPU chip 12, I/O connectors 29, and memory connectors 30. The EMI/RFI shielding of the cage 11, separates low frequency EMI/RFI emitting components from high frequency EMI/RFI emitting components such that computer components will operate without interfering EMI/RFI emissions. Moreover, by placing electrical components emitting lower frequency EMI/RFI within the cage 11, reduced EMI/RFI emissions escape through the option devices' slots or openings to the exterior of the computer enclosure, thereby meeting the strict EMI/RFI guidelines set by the FCC.

Figure 2:
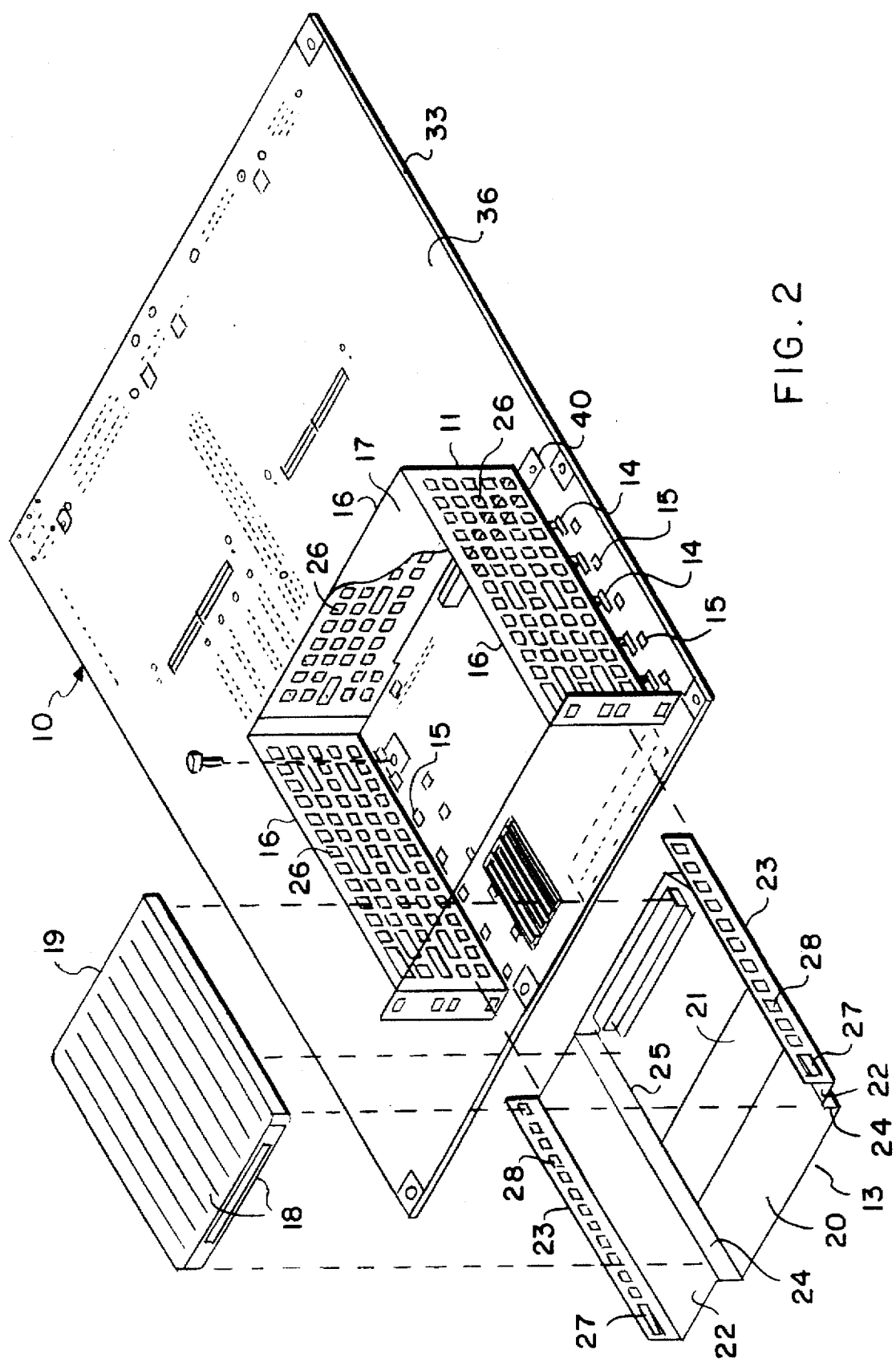
FIG. 2 is a frontal perspective view of the cage and logic board shown in FIG. 1, wherein the cage has tabs in contact with the grounding pads of the logic board. An option device bracket for holding electrical devices is in an aligned position for slideable mounting along mounting tabs within the cage.
Figure 3:
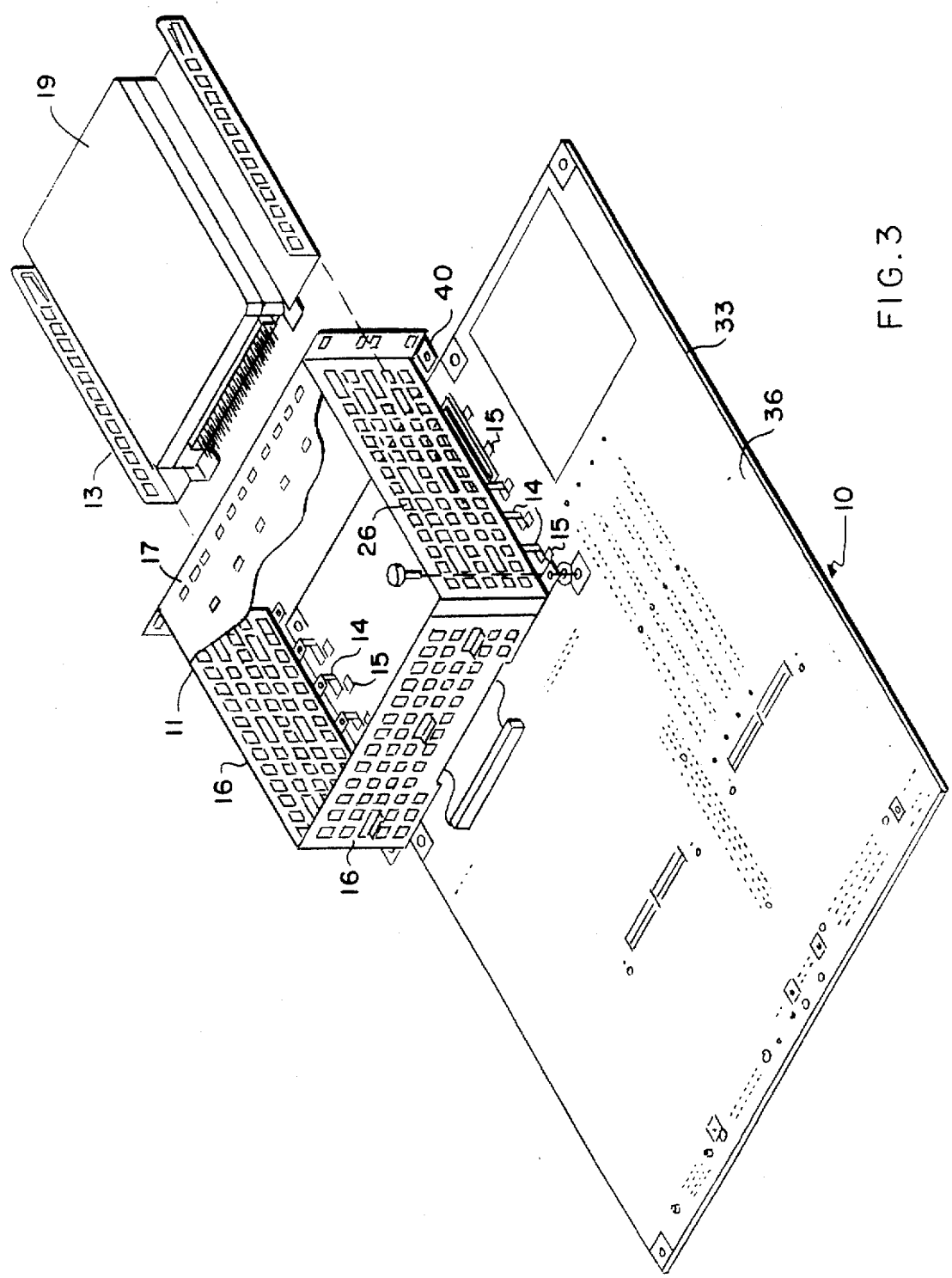
FIG. 3 is a rear perspective view of the cage and logic board shown in FIGS. 1 and 2, wherein the cage is groundingly mounted upon the logic board. An option device bracket for holding electrical devices is aligned for slideable mounting along mounting tabs within the cage.

FIGS. 2 and 3 show the cage 11 mounted to the logic board 10, and an option device bracket 13 being aligned in position for mounting within the cage 11.

The cage 11, as shown in FIG. 1, is groundingly mounted on the logic board. As shown, the lower edge region of the cage 11 includes spaced apart grounding tabs 14 in electrical contact with the grounding plane through grounding pads 15 on the surface of the top layer 33 of the logic board 10. Shown in FIG. 4, a solder mask layer 36 covers the surface of the top layer 33 of the logic board 10, wherein the grounding pads 15 are cut into the solder mask layer 36 and are on the top layer 33 of the logic board. Plated through holes, or "blind vias," 31, extend from the grounding pads 15 to the ground plane 32, one layer from the top layer of a multi-layered logic board 10 to electrically ground the grounding pads 15 and form and EMI/RFI shield from electrical contact between the ground plane 32, grounding pads 15 and grounding tabs 14.

Figure 4:
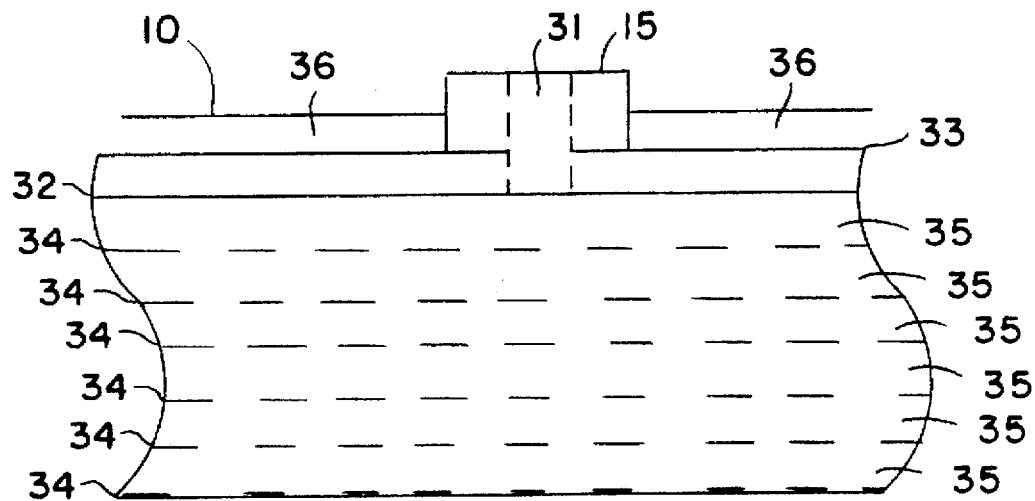
FIG. 4 is a side cut away view of a logic board having a plurality of layers with a blind via groundingly connecting a grounding pad to a ground plane.

As shown in FIG. 4, blind vias 31, plated through holes of minimal diameter, electrically connect the grounding pads through the top layer 33 of the logic board 10 to the ground plane 32. Blind vias 31 electrically connect grounding pads 15 to the ground plane 32 but do not continue into subsequent logic board layers 35 and signal planes 34, and have a diameter appreciably smaller than use of mounting vias (not shown) in the prior art, thereby providing substantial etching areas and unimpeded signal routing through one or more subsequent logic board layers 35 and signal planes 34.

Figure 5:
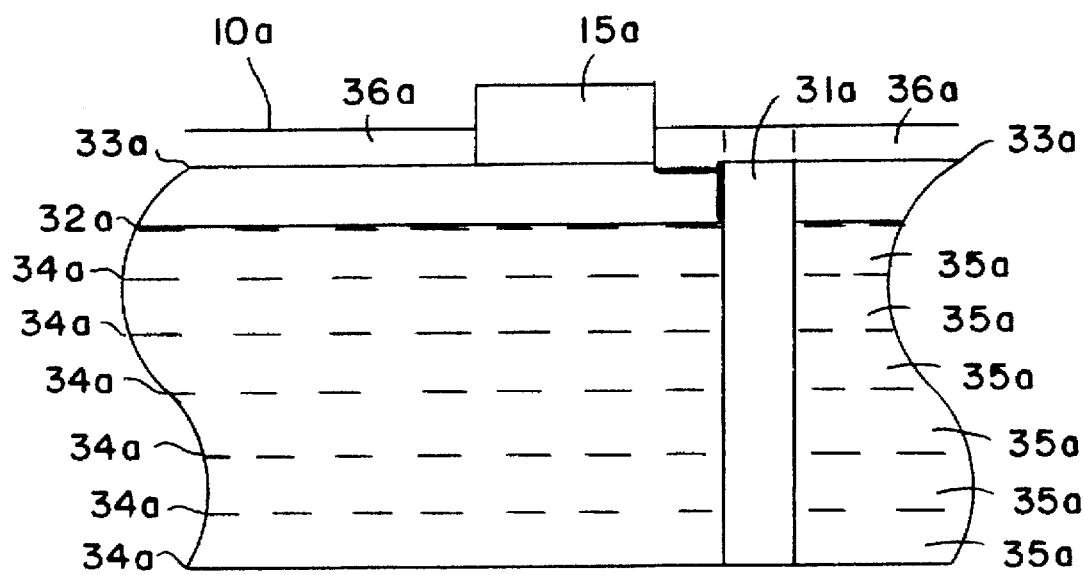
FIG. 5 is a side cut away view of a logic board having a plurality of layer with a signal via groundingly connecting a grounding pad to a ground plane.

As shown in FIG. 5, an alternative embodiment uses signal vias 31a, plated through holes, to electrically connect through the logic board 10a the same elements as shown in FIG. 4, grounding pads 15a to a ground plane 32a. This alternative via arrangement differs from the preferred embodiment shown in FIG. 4 through use of a signal via 31a that continues from the top layer 33a through the logic board 10a to the ground plane 31a and all subsequent logic board layers 35a and signal planes 34a. Although signal vias 31a continue through all subsequent logic board layers 35a and signal planes 34a, signal vias 31a have a diameter appreciably smaller than mounting vias used in prior art (not shown), thereby providing substantial etching areas with minimal impedance of signal routing of the signal planes 34a through one or more logic board layers 35a. Moreover, etching extending from one signal via 31a may be employed to extend to one or more grounding pads 15a, such that employing less vias to ground the grounding pads causes less restrictions on etching areas and less impedance of signal routing.

In the preferred embodiment shown in FIG. 4, the logic board has a plurality of eight layers that include an outer layer 33, a ground plane 31 and six subsequent pairs of signal planes 34 and logic board layers 35. However, other embodiments may have more or less logic board layers 35 and signal planes 34 than shown in the embodiment of FIG. 4. Moreover, the logic board 10 shown in the embodiment of FIG. 4 has logic board layers 35 made of FR4, however, alternative embodiments may include logic boards 10 having logic board layers 35 made of other types of silicon and fiberglass materials.

Shown in FIGS. 2 and 3, the grounding tabs 14 are spaced apart a distance forming an EMI/RFI shield to attenuate high frequency EMI/RFI emitted by electrical devices and electronic circuitry. Grounding tabs 14 are spaced apart a distance to shield the cage 11 from high frequency EMI/RFI emissions of electrical devices and circuitry externally mounted on the logic board 10 relative to the cage 11. Shielding EMI/RFI emissions from entering the cage reduces the EMI/RFI emitted from the computer enclosure through the openings and slots 18 of the option devices 19 held within the cage 11.

As shown in the figures, grounding pads 15, grounding tabs 14 and a grounding plane are used to groundingly mount the cage 11 to the logic board 10. However, other embodiments of this invention may employ an alternative grounding source and other grounding means. For example, for one alternative embodiment, the computer enclosure's metallic face (not shown), located at a logic board edge is the electrical grounding source, whereby electrical contact between the front edge of the cage and the computer enclosure's metallic face plate (not shown) electrically grounds the cage. For another alternative embodiment, a grounded enclosure is the grounding source, whereby a conductive fastener (not shown) electrical connects a grounding pad through the logic board 10 to a grounded enclosure (not shown), thereby grounding the cage 11.

Factors such as shielding effectiveness, maximum opening dimension, signal wavelength frequency, and thickness of the cage walls 16 are applied in a conventional manner to determine the optimal distance between the tabs 14 for providing effective EMI/RFI shielding. Generally, the higher the wavelength frequency, the smaller the wavelength amplitude and therefore, the smaller the distance between the tabs.

The cage 11 includes three walls 16 having apertures and a top 17 (shown in FIG. 1) forming 4 sides of an open ended receptacle with grounding pads accessing the ground plan as another side. The apertures 18 of the walls 16 provide a dual function. First, the apertures provide thermal ventilation of the components and circuitry mounted within the option enclosure. Second, the apertures 18 have a shape and size for reducing the EMI/RFI emissions entering or exiting the cage. The factors for determining the distance between tabs 14 are accordingly used to determine the size and shape of the apertures 18. An additional factor for determining the relationship between wavelength frequency and the maximum opening size of the apertures 18 of the walls 16 is the number of apertures 18 on the walls 16. The resulting relationship between EMI/RFI frequency and maximum opening has been determined to be as follows:

| Frequency (MHz) | Maximum Opening (mm) |
| --- | --- |
| 500 | 30 |
| 1000 | 15 |
| 2000 | 7.5 |
| 5000 | 3 |

The option device bracket 13 of rigid material is a one piece bracket comprising a base 20 having a cabling hole 21 for access to connectors mounted below the cage 11 on the logic board 10, two walls 24 for laterally supporting the option device, two shelves 22, and two riding walls 23 having apertures for slideable mounting of the option device bracket 13 within the cage. The size of the hole 21 is such that cables (not shown) can fit through the hole 21 to connect the option devices 19 to the connectors 22 on the logic board 10. The dimensions of the base 20 facilitate the mounting of option devices 19 within the option device bracket 13. Each of the two walls 24 extend perpendicularly from one of the long edges 25 of the base 20. The walls 24 firmly hold option devices 19 within the option device bracket 13. Each of the walls 24 extend to a shelf 22. Each shelf 22 adds to the width of the base 20 such that the option device bracket 13 slideably mounts within the cage 11 creating a snug fit relationship within the cage 11.

Extending from each one of the shelves 22 is a riding wall 23. Each of the riding walls 23 is aligned for entry between the walls 16 of the cage 11, such that each of the riding walls 23 slideably mounts within the inner surface of the walls 16. The apertures 26 of the walls 16 are of the same shape and size, such that once the option bracket device is in a fully mounted position within the cage 11, the apertures 28 of the riding walls 23 become fully aligned relative to each other. Fully aligned apertures of the same shape and size promote consistent shielding of EMI/RFI emissions.

The inwardly facing surface of the walls further include mounting tabs 26 for mounting the option device bracket 13 within the cage 11. There are three spaced apart mounting tabs 26 perpendicularly attached to the bottom edge of three apertures on each of the wails 16. Although there are three mounting tabs 26, other embodiments may use a different means for mounting the option device bracket 13. For example, hooks (not shown) mounted along the walls 16 could be used to mount the option device bracket 13. Moreover, depending upon the type of option device 19, a different number of mounting tabs 26 may be used to support the option device 19 both during and after the option device bracket 13 is slideably mounted within the cage 11.

The option device bracket 13 further includes locking tabs 27 attached to each of the riding walls 23. Once the option device bracket 13 is slideably mounted along the mounting tabs 26, the locking tabs 27 press against the apertures 18 of the walls 17 to interlock and secure the option device bracket 13 within the cage 11.

The option devices 19 mounted within the option device bracket 13 may include devices such as floppy disk drives, hard disk drives, CD ROM drives, fax modems, PCMCIA cards or other option devices. Because this invention is applicable for many types of electronic devices, this invention may be used for other electronic equipment such as telecommunication systems, stereo equipment, home entertainment electronic devices, electrical monitors, appliances, and other devices wherein an option device is mounted upon a logic board within an enclosure. Accordingly, other embodiments may include other types of option devices 19 mounted within an option device bracket 13 in spaced relation to a device's logic board 10 mounted within a receptacle.

FIG. 4 shows an option device bracket 13 in a fully mounted position within the cage 11. The option device bracket 13, as show in FIGS. 1–3, was in a position for slideable mounting along the mounting tabs 26 within the cage 11. In a fully mounted position, the apertures 28 of the riding walls 23 are aligned relative to the apertures 18 of the walls 16, such that insertion of the option device bracket 13 may only marginally affect the EMI/RFI shielding and ventilation through the walls 16.

The walls 17 may include a second row of mounting tabs (not shown) for firmly mounting the option device bracket 13 within the cage 11. The second row of mounting tabs braces the top edge of the riding walls 23 such that the two rows of mounting tabs promote a snug fit relationship between the cage 11 and the option device bracket 13.

Once the option device bracket 13 is fully mounted within the cage 11, each of the two locking tabs 27 press against an aperture 16 to interlock and secure the option device brackets 13 within the cage 11.

Figure 6:
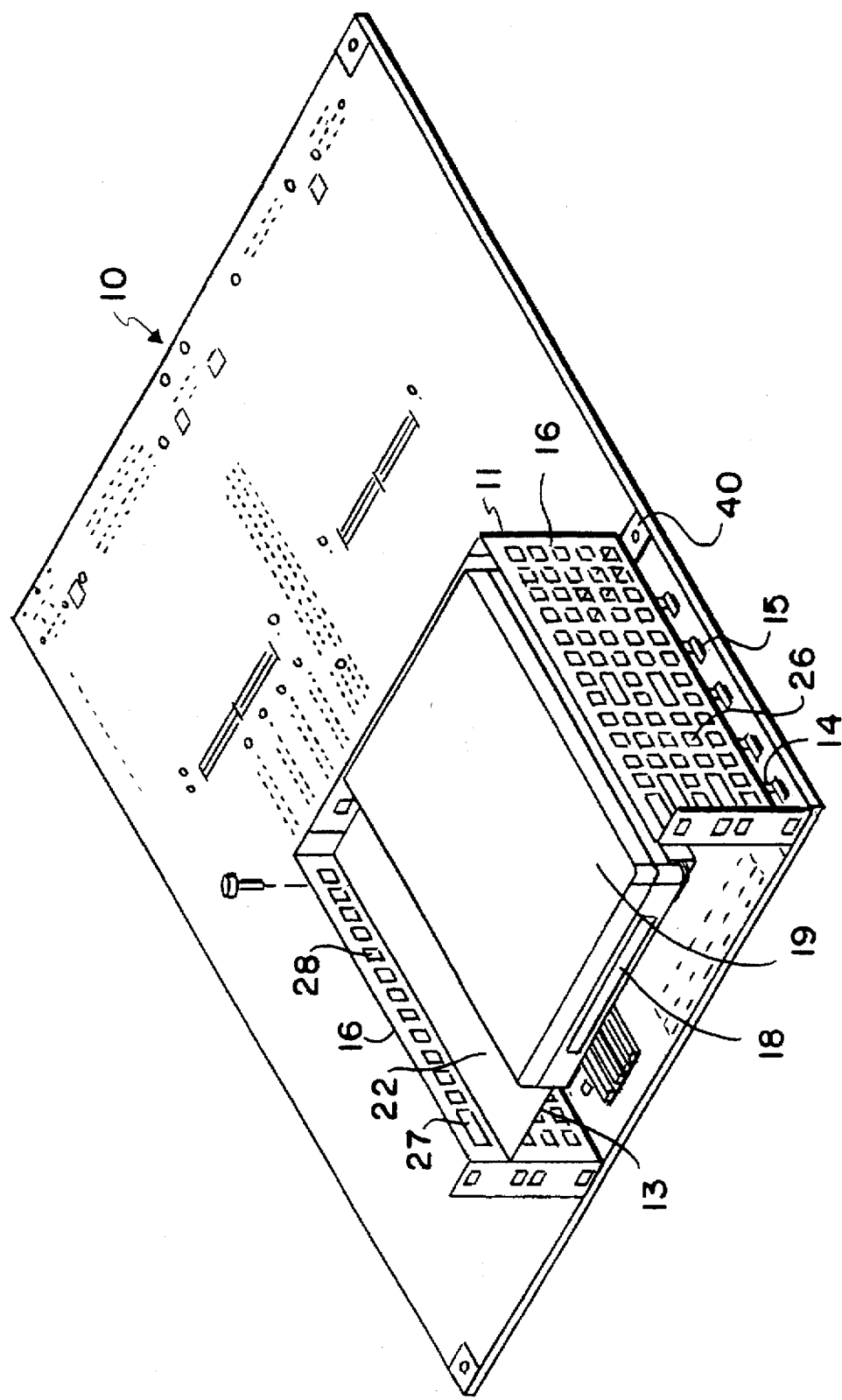
FIG. 6 is a front perspective view of the cage, logic board, and option device bracket for mounting electrical devices in spaced relation to the major surface of the logic board as shown in FIGS. 2 and 3, wherein the option device bracket is in a fully mounted position after being slideably mounted along the mounting tabs forming a snug fit relationship within the cage.

As shown in FIGS. 2,3 and 6, other embodiments of this invention may include one or more option device brackets 13 within the cage 11. For example, two option device brackets 13 may be used to mount two option devices 19 such as a floppy drive and a hard drive. Moreover, the type of option device 19 mounted within the cage 11 would determine the dimensions of the base 20, cabling hole 21, walls 25 and shelf 22. An additional option device bracket 13 mounted along the inwardly facing surface of the walls 16 may use for support another row of mounting tabs 26 (not shown). If the additional option device bracket 13 is mounted along the upper region of the walls 17, a row of mounting tabs 26 below the riding wall 23 and the above inwardly facing surface of the top 17, as shown in FIG. 1, may support the option device bracket 13 in a mounted position within the cage 11. For other embodiments, support of the additional option device bracket may include other means such as hooks, rollers, etc.

It is apparent that, within the scope of the invention, modifications and different arrangements may be made other than as herein disclosed. The present disclosure is merely illustrative, the invention comprehending all variations thereof.

What is claimed is:

1. Apparatus comprising:

a logic board including electrical grounding pads on the major surface thereof and an electrical grounding plane in electrical communication with such pads;

a cage of rigid material mounted on the logic board for holding an electrical device therein, the cage including spaced apart walls and a top connecting the walls, the walls and top having spaced apart apertures of a size and shape to promote thermal ventilation of an electrical device located in the cage and to shield EMI/RFI, the cage including spaced apart electrical grounding tabs at the lower edge region of the cage in electrical grounding contact with the electrical pads, the grounding tabs being spaced apart a distance effective to form an EMI/RFI shield to EMI/RFI originating both within the cage and outside the cage; and a one piece option device bracket of rigid material sliceably mounted in the cage for holding the electrical device, such bracket including:

a base having a cabling hole of a size effective to connect the electronic device to connectors on the logic board;

a pair of opposing spaced apart walls for lateral support of the electrical device, each wall extending in perpendicular relationship relative to the base;

a pair of shelves in parallel relationship relative to the base and extending perpendicularly from the walls; and a pair of riding walls at opposing edges of the bracket and extending perpendicularly from the shelf, each of the riding walls having spaced apart apertures equal in size, shape, and positioning with respect to the apertures of the walls of the cage that the apertures of the cage and the bracket are aligned when the bracket is mounted within the cage, such alignment of the apertures promoting consistent ventilation and EMI/RFI shielding by the walls of the bracket and by the walls of the cage.

2. The apparatus of claim 1, wherein the cage further includes mounting tabs on the opposing inwardly facing surfaces of the wails receiving the option device bracket.

3. The apparatus of claim 2, wherein a pair of rows of the mounting tabs are arranged in a parallel spaced apart relationship along the inwardly facing surfaces of the walls, wherein the distance between the pair of rows provides a snug fit relationship of the option device bracket between one row of mounting tabs and the other row of mounting tabs.

4. The apparatus of claim 2, wherein a row of the mounting tabs is arranged in parallel spaced relationship with the top of the cage, wherein the distance between the row of mounting tabs and the top of the cage provides a snug fit relationship of the option device bracket between the row of mounting tabs and the cage.

* * * * *